United States Patent [19]

Alexander

[11] Patent Number: 5,422,190
[45] Date of Patent: Jun. 6, 1995

[54] VIA FILL PASTE AND METHOD OF USING THE SAME CONTAINING SPECIFIC AMOUNTS OF SILVER, GOLD AND REFRACTORY OXIDES

[75] Inventor: John H. Alexander, Goleta, Calif.

[73] Assignee: Ferro Corporation, Cleveland, Ohio

[21] Appl. No.: 7,574

[22] Filed: Jan. 22, 1993

[51] Int. Cl.⁶ .............................. H01H 1/02
[52] U.S. Cl. .................. 428/552; 428/548; 428/554; 252/514; 420/503
[58] Field of Search .......... 252/514; 428/548, 552, 428/554, 210, 131, 209, 434; 174/257; 420/503

[56] References Cited

U.S. PATENT DOCUMENTS

| | | | |
|---|---|---|---|
| 2,942,992 | 7/1960 | Dumesnil | 106/48 |
| 3,554,796 | 1/1971 | Liederbach et al. | 117/227 |
| 3,970,590 | 7/1976 | Hoffman et al. | 252/514 |
| 4,004,057 | 1/1977 | Hoffman et al. | 428/209 |
| 4,018,630 | 4/1977 | Hill et al. | 148/11.5 P |
| 4,612,601 | 9/1986 | Watari | 361/387 |
| 4,636,332 | 1/1987 | Craig et al. | 252/514 |
| 4,711,835 | 12/1987 | Dufour | 430/314 |
| 5,009,708 | 4/1991 | Grünwald et al. | 106/105 |
| 5,011,725 | 4/1991 | Foster | 428/137 |
| 5,316,985 | 5/1994 | Jean et al. | 501/16 |

*Primary Examiner*—Donald P. Walsh
*Assistant Examiner*—Anthony R. Chi
*Attorney, Agent, or Firm*—Rankin, Hill, Lewis & Clark

[57] ABSTRACT

The present invention provides a new and useful via fill paste for use in the construction of electronic circuit devices. The unique via fill paste is capable of electrically connecting conductive layers made of dissimilar metals such as gold and silver. The via fill paste includes gold, silver, palladium and a refractory oxide. The refractory oxide comprises one or more metals selected from the group consisting of zirconium, yttrium, niobium, tantalum, lanthanum, thorium, hafnium, cerium, praseodymium, neodymium, samarium, europium, gadolinium, terbium, dysprosium, holmium, erbium, thulium, ytterbium and lutetium.

5 Claims, 1 Drawing Sheet

VIA FILL PASTE AND METHOD OF USING THE SAME CONTAINING SPECIFIC AMOUNTS OF SILVER, GOLD AND REFRACTORY OXIDES

TECHNICAL DISCLOSURE

The present invention concerns a material for use in constructing electronic circuits or devices. More particularly, the present invention concerns a new and improved via fill paste for use in electrically connecting the conductive layers of an electronic circuit or device.

BACKGROUND

A variety of metal-containing compositions (i.e., pastes, inks, tapes, films, etc.) are useful in forming electronic circuits or devices. These metal-containing compositions are used to produce electrically conductive conduits within the electronic circuits or devices. Generally, electronic devices or circuits comprise two or more layers of electrically conductive conduits or paths. Various techniques may be employed in order to electrically connect one conductive layer to another. One common technique is to form a via or opening through the insulative layer disposed between the conductive layers which are to be electrically connected. These vias or openings are then filled with a conductive paste (via fill paste). The via fill paste serves to provide an electrical bridge or connection between the conductive layers.

Because of its high electrical conductivity, and relatively low cost as compared to metals such as gold, silver is generally a preferred material for use in forming a conductive layer. However, as to exposed or surface applications, gold is many times preferred over silver. More particularly, silver has a propensity to migrate under conditions of high humidity. As a consequence, gold is many times the preferred material for forming a conductive surface layer in an electronic circuit or device.

Accordingly, if possible, it would be desirable when producing some multilayer electronic circuits or devices to utilize buried conductive layers made of silver and exposed layers made of gold. Unfortunately, however, electrically connecting a gold layer to a silver layer can present a problem. More particularly, the markedly different diffusion rates of gold and silver in each other and in other precious metals can produce a buildup of Kirkendahl voids at one or both of the conductor via interfaces resulting in an open circuit. This is why many electronic circuits or devices, such as circuits or devices produced using low temperature cofired tape, are made completely with silver (e.g., buried silver layers, silver via fills, and surface silver) or completely with gold.

SUMMARY OF INVENTION

The present invention provides a new and improved via fill paste and a method of using the same. The unique via fill paste is capable of connecting conductive layers made of dissimilar metals. Specifically, the via fill paste facilitates the electrical connection of a layer of conductive silver to a layer of conductive gold and minimizes the formation of an excessive number of Kirkendahl voids. Thus, the present via fill paste avoids the formation of an open circuit when the electronic circuit or device is being utilized.

In one embodiment the via fill paste comprises silver powder, gold powder, palladium powder, a refractory oxide and a vehicle. The refractory oxide comprises one or more metals selected from the group consisting of zirconium, yttrium, niobium, tantalum, lanthanum, thorium, hafnium, cerium, praseodymium, neodymium, samarium, europium, gadolinium, terbium, dysprosium, holmium, erbium, thulium, ytterbium and lutetium. Preferably, the refractory oxide is selected from the group consisting of zirconium, yttrium, niobium, neodymium, cerium, lanthanum and praseodymium. More preferably, the refractory oxide is selected from the group consisting of zirconium, cerium and yttrium.

The foregoing and other features of the invention are hereinafter more fully described and particularly pointed out in the claims. The following description sets forth in detail certain illustrative embodiments of the invention, those being indicative, however, of but a few of the various ways in which the principles of the invention may be employed.

DETAILED DESCRIPTION

Figure 1:
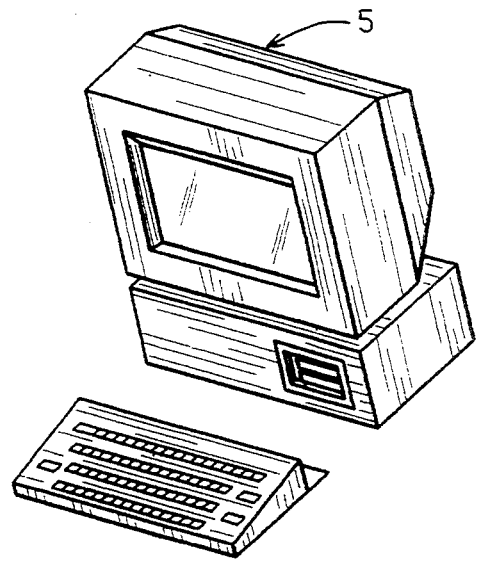
FIG. 1 is a perspective view of a piece of electronic equipment capable of employing an electronic circuit or device made using the via fill paste of the present invention.
Figure 2:
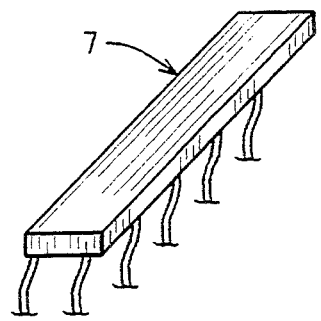
FIG. 2 is a perspective view of an electronic device made using the via fill paste of the present invention.

Referring to the drawings, and initially to FIGS. 1 and 2 there is illustrated a piece of electronic equipment (computer) 5 which employs an electronic device 7 made utilizing the via fill paste of the present invention. The via fill paste of the present invention may be utilized to produce any number of electronic devices or circuits, for example, hybrid integrated circuits, integrated circuit packages, rectifiers, capacitors, resistors and various semiconductor devices. Such devices and circuits may be utilized to produce a variety of electronic equipment, for example, transmitters, receivers, amplifiers, controllers, recorders, power supplies, converters, television and video components.

A via fill paste or material made in accordance with the present invention comprises silver powder, gold powder, palladium powder and refractory oxide. In order to facilitate use of the paste, some type of vehicle is also employed.

Any number of commercially available high purity gold, silver and palladium powders may be utilized to produce the via fill paste. The gold powder, the silver powder and the palladium powder each have an average particle size of from about 0.5 to about 10 microns. Preferably, the gold powder, the silver powder and the palladium powder each have an average particle size of about 5 microns.

The refractory oxide comprises one or more metals selected from the group consisting of zirconium, yttrium, niobium, tantalum, lanthanum, thorium, hafnium, cerium, praseodymium, neodymium, samarium, europium, gadolinium, terbium, dysprosium, holmium, erbium, thulium, ytterbium and lutetium. Preferably, the refractory oxide includes one or more metals selected from the group consisting of zirconium, yttrium, niobium, neodymium, cerium, lanthanum and praseodymium. More preferably, the refractory oxide comprises one or more metals selected from the group consisting of zirconium, cerium and yttrium. Further preferred, the refractory oxide comprises zirconium oxide. Any number of commercially available high purity refractory oxide powders may be used to prepare the via fill paste. The refractory oxide has an average particle size of from about 0.5 to about 5 microns. Preferably, the refractory oxide has an average particle size of about 3 microns.

The via fill material comprises a solids portion and a vehicle. As used herein this specification and the claims below the term "solids portion" means that portion of the via fill material exclusive of vehicle or any similar materials or components that are substantially removed (volatilized) during drying or firing steps. The solids portion comprises from about 20 to about 90 percent by weight silver powder, from about 2 to about 25 percent by weight gold powder, from about 0.5 to about 10 percent by weight palladium powder and from about 0.5 to about 20 percent by weight refractory oxide. Preferably, the solids portion comprises from about 30 to about 85 percent by weight silver powder, from about 2 to about 25 percent by weight gold powder, from about 1 to about 8 percent by weight palladium powder and from about 1 to about 15 percent by weight refractory oxide. More preferably, the solids portion comprises from about 40 to about 80 percent by weight silver powder, from about 3 to about 20 percent by weight gold powder, from about 1.5 to about 7 percent by weight palladium powder and from about 1.5 to about 12 percent by weight refractory oxide.

The ratio of vehicle to solids portion may vary considerably and is dependent upon the manner in which the paste is supplied and the type of vehicle utilized. Normally, the via fill paste comprises from about 20 to about 95 percent by weight solids portion and from about 3 to about 40 percent by weight vehicle. Preferably, the via fill material comprises from about 25 to about 90 percent by weight solids portion and from about 5 to about 30 percent by weight vehicle. More preferably, the via fill material comprises from about 30 to about 85 percent by weight solids portion and from about 10 to about 25 percent by weight vehicle.

Any number of commercially available vehicles may be used to produce the via fill paste. Although rheological properties are of significant importance, the vehicle is preferably formulated also to give appropriate wettability of the solids and the substrate, good drying rate, dried film strength sufficient to withstand rough handling and good firing properties. The vehicle is typically a resin dissolved in a solvent and, frequently, a solvent solution containing both a resin binder and a thixotropic agent. The solvent usually boils within the range of about 130° C. to about 350° C.

A commonly utilized resin is ethyl cellulose. Additional resins include, for example, ethyl hydroxy ethyl cellulose, wood rosin, mixtures of ethyl cellulose and phenolic resins, polymethacrylates of lower alcohols and monobutyl ether of ethylene glycol monoacetate.

Commonly employed solvents include terpenes such as alpha- or beta-terpineol or mixtures thereof with other solvents such as kerosene, dibutyl phthalate, butyl carbitol, butyl carbitol acetate, hexylene glycol and high boiling alcohols and alcohol esters. Various combinations of these and other solvents formulated to obtain the desired viscosity and volatility may be utilized.

Among the thixotropic agents that are commonly used are organic based thixotropics such as, for example, hydrogenated castor oil and derivatives thereof and ethyl cellulose. A wetting agent may be employed such as, for example, fatty acid esters (e.g., N-tallow-1, 3-diaminopropane di-oleate, N-tallow trimethylene diamine diacetate, N-coco trimethylene diamine, beta diamines, N-oleyl trimethylene diamine, N-tallow trimethylene diamine and N-tallow trimethylene diamine dioleate.

The paste according to the present invention may be prepared on a three-roll mill. The amount and type of carrier utilized is determined mainly by the final desired formulation viscosity and thickness. The solids portion are mixed with the vehicle and dispersed in the three-roll mill to form a suspension. Preferably, when producing the paste for a screen printing application, the paste has a viscosity of about 700 poise as determined on the Down Curve at 9.6 sec$^{-1}$ using a CARRI-MED viscometer. The CARRI-MED is utilized at a 2 cm diameter setting, 1° cone at 25° C.

Of course, it will be appreciated that pastes having a variety of viscosities may be produced, the specific desired viscosity being a function of the application technique, substrates utilized, the configuration of the green (unfired) circuit or electronic device.

A via fill paste made in accordance with the teachings of the present invention may be utilized in connection with various insulative substrate materials. For example, the substrate may comprise a glass or ceramic material. More particularly, for example, the substrate material may comprise electronic cofired tape, alumina ($Al_2O_3$), aluminum nitride (AlN), beryllia (BeO) and silicon carbide (SIC).

Various conductive layers or lines may be used in connection with the present invention. Such layers or lines may be formed utilizing various commercially available conductive paste materials. Preferably, the conductive layers comprise primarily gold and silver. More particularly, a paste made in accordance with the present invention is utilized in conjunction with a conductive layer comprising silver and a conductive layer comprising gold.

The via fill paste may be utilized in connection with various firing procedures and conditions including firing in air at relatively low temperatures (e.g., from about 750° C. to about 950° C., preferably from about 800° C. to about 900° C.).

The following examples will serve to illustrate the novel features and advantages of the present invention. While these examples will show one skilled in the art how to operate within the scope of this invention, they are not to serve as a limitation on the scope of the invention for such scope is only defined by the claims below.

Example I

The components listed in Table I were weighed in accordance with the prescribed mixing ratio to provide a total amount of a 100 g batch of the via fill material.

The solids were dispersed into the vehicle using a three-roll mill.

TABLE I

| Materials Used | Weight |
| --- | --- |
| [1]Silver powder | 20 g |
| [2]Silver powder | 20 g |
| [3]Silver powder | 20 g |
| [4]Gold powder | 12.8 g |
| [5]Palladium powder (metallic) | 3.2 |
| [6]Zirconium powder (ZrO$_2$) | 5.0 |
| [7]Vehicle | 19.0 |

[1]Silver powder available from Tech Inc. of Anaheim, California, under the trade designation SP170.
[2]Silver powder available from Degussa Metz Metals Group of Plainfield, New Jersey, under the trade designation K150.
[3]Silver powder available from Degussa Metz Metals Group of Plainfield, New Jersey, under the trade designation 3000-2.
[4]Gold powder available from PGP Industries, Inc. of Santa Fe Springs, California, under the trade designation 09-550.
[5]Palladium powder available from Degussa Metz Metals Group of Plainfield, New Jersey, under the trade designation Pd#4.
[6]Zirconium powder available from Zirconia Sales (America) Inc. of Atlanta, Georgia, under the trade designation HSY 3.0.
[7]Vehicle available from the Ferro Corporation of Cleveland, Ohio, under the trade designation 377.

The components listed in Tables II and III were weighed in accordance with the prescribed mixing ratios to provide a total amount of a 100 gram batch of silver based paste and gold based paste for forming conductive layers. The solids were dispersed in the vehicles using a three-roll mill.

TABLE II

| Silver Paste | |
| --- | --- |
| Materials Used | Weight |
| [1]Silver powder | 72 g |
| [2]Glass binder | 8 g |
| [3]Vehicle | 20 g |

[1]Silver powder available from Degussa Metz Metals Group of Plainfield, New Jersey, under the trade designation 3000-1.
[2]Glass binder available from Ferro Corporation of Cleveland, Ohio, under the trade designation EG2712.
[3]Vehicle available from Ferro Corporation of Cleveland, Ohio, under the trade designation V126.

TABLE III

| Gold Paste | |
| --- | --- |
| Materials Used | Weight |
| [1]Gold powder | 75 g |
| [2]Glass binder | 3 g |
| [3]Glass binder | 2 g |
| [4]Vehicle | 20 g |

[1]Gold powder available from Degussa Metz Metals Group of Plainfield, New Jersey, under the trade designation 1775.
[2]Glass binder available from Ferro Corporation of Cleveland, Ohio, under the trade designation EG2702.
[3]Glass binder available from Ferro Corporation of Cleveland, Ohio, under the trade designation EG2712.
[4]Vehicle available from Ferro Corporation of Cleveland, Ohio, under the trade designation V194.

TABLE IV

| Gold Paste | |
| --- | --- |
| Materials Used | Weight |
| [1]Gold powder | 76.1 g |
| [2]Glass binder | 4.9 g |
| [3]Vehicle | 19.0 g |

[1]Gold powder available from Degussa Metz Metals Group of Plainfield, New Jersey, under the trade designation 1775.
[2]Glass binder available from Ferro Corporation of Cleveland, Ohio, under the trade designation EG2712.
[3]Vehicle available from Ferro Corporation of Cleveland, Ohio, under the trade designation V194.

Figure 3:
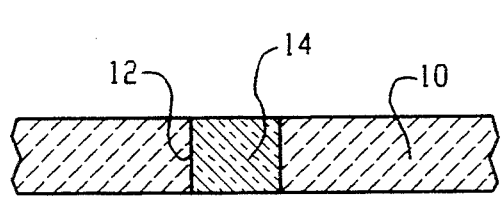
FIG. 3 is a fragmented cross-sectional view of a substrate including the via fill paste of the present invention.
Figure 4:
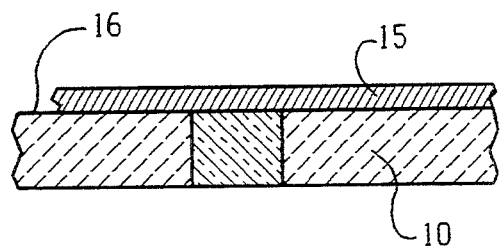
FIG. 4 is a fragmented cross-sectional view of the substrate of FIG. 3 including a layer of gold conductive paste deposited along one of the major surfaces of the substrate.
Figure 5:
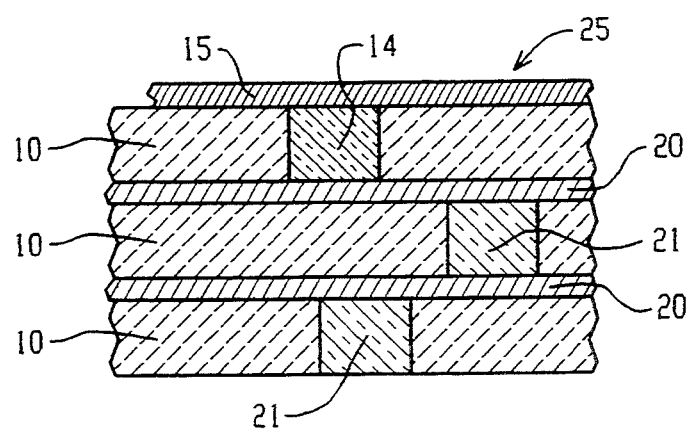
FIG. 5 is a fragmented cross-sectional view of the substrate of FIG. 4 registered with additional substrates having layers of silver conductive paste deposited along the major surfaces of the substrates.

An electronic circuit is produced by using a section of A-6 low temperature cofired electronic tape 10 as shown in FIG. 3. A-6 cofired electronic tape is commercially available from the Ferro Corporation of Cleveland, Ohio. Vias or holes 12 are formed in tape 10. The via fill paste indicated at 14 made in accordance with Table I is then screen printed into the vias 12. A gold conductive paste layer 15 as shown in FIG. 4 is then screen printed on one major surface 16 of substrate 10. The conductive gold paste is made using a paste made in accordance with Table III. Successive layers of conductive silver paste 20 and conventional silver via fill paste 21, such as, FX-33084 silver via fill paste available from Ferro Corporation of Cleveland, Ohio, are screen printed on additional sections of tape 10 and the layers are registered and stacked to form a sandwich like circuit package 25 as shown in FIG. 5. The via holes 12 have a diameter of 0.0075 inches. The gold conductive layer 15 and the silver conductive layer 20 are applied to provide a thickness of 0.0005 inches.

The electronic circuit or package 25 is then dried by heating to 85° C. for a period of 5 minutes. The resin binder is then removed by heating the package 25 to 450° C. at 2° C./min and holding for 1.5 hours. During the drying step volatile constituents are driven from pastes 15, 14 and 20. The package 25 is then fired at a temperature of 850° C. for 10 minutes in an atmosphere comprising air. During firing the metal particles and glass binder are sintered together in a controlled manner. After firing the package 25 is cooled down in a controlled manner to prevent unwanted chemical reactions at intermediate temperatures or substrate fracture due to excessive cooling rates.

It will be appreciated that in addition to serving as a paste for filling vias, the paste of the present invention may be utilized in other applications wherein one wants to electrically connect conductive paths containing dissimilar metals. For example, the paste of the present invention may be utilized when building up circuits on an alumina substrate by printing silver conductors and dielectric layers and finishing with gold conductors and the paste of the present invention in exposed areas.

Other features and aspects of this invention will be appreciated by those skilled in the art upon reading and understanding this specification. Such features, aspects and expected variations and modifications are clearly within the scope of this invention, and this invention is limited solely by the scope of the following claims.

What is claimed:

1. An electronic device comprising a layer of a first conductive material comprising gold, a layer of a second conductive material comprising silver, and an insulative substrate located between said first conductive material and said second conductive material, said insulative substrate including a via and a fill material disposed in said via and electrically connecting said first conductive material and said second conductive material, said fill material formed by firing a composition comprising from about 40 to about 80 percent by weight silver, from about 3 to about 20 percent by weight gold, from about 1.5 to about 7 percent by weight palladium and from about 1.5 to about 12 percent by weight refractory oxide, said refractory oxide comprising one or more metals selected from the group consisting of zirconium, yttrium, niobium, tantalum, lanthanum, thorium, hafnium, cerium, praseodymium, neodymium, samarium, europium, gadolinium, terbium, dysprosium, holmium, erbium, thulium, ytterbium and lutetium.

2. An electronic device as set forth in claim 1 wherein said refractory oxide is selected from the group consisting of zirconium, cerium and yttrium.

3. A via fill paste material for electrically connecting a first conductive layer comprising gold to a second conductive layer comprising silver, said via fill material comprising from about 20 to about 90 percent by weight solids portion and from about 3 to about 30 percent by weight vehicle, said solids portion comprising from about 40 to about 80 percent by weight silver, from about 3 to about 20 percent by weight gold, from about 1.5 to about 7 percent by weight palladium and from about 1.5 to about 12 percent by weight refractory oxide, said refractory oxide comprising one or more metals selected from the group consisting of zirconium, yttrium, niobium, tantalum, lanthanum, thorium, hafnium, cerium, praseodymium, neodymium, samarium, europium, gadolinium, terbium, dysprosium, holmium, erbium, thulium, ytterbium and lutetium.

4. A via fill material as set forth in claim 3 wherein said via fill material comprises from about 20 to about 95 percent by weight of said solids portion and from about 3 to about 40 percent by weight of said vehicle.

5. A via fill material as set forth in claim 3 wherein said refractory oxide comprises one or more metals selected from the group consisting of zirconium, cerium and yttrium.

* * * * *